(12) United States Patent
Chung (10) Patent No.: US 7,978,279 B2
(45) Date of Patent: Jul. 12, 2011

(54) PANEL RECEIVING DEVICE

(75) Inventor: Hee Uk Chung, Kumi-shi (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/330,132

(22) Filed: Dec. 30, 2002

(65) Prior Publication Data

US 2003/0214614 A1    Nov. 20, 2003

(30) Foreign Application Priority Data

May 17, 2002  (KR) .................. 10-2002-0027438

(51) Int. Cl.
| G02F 1/1333 | (2006.01) |
| A47G 19/08 | (2006.01) |
| B65D 85/48 | (2006.01) |

(52) U.S. Cl. .............. 349/58; 211/41.14; 211/41.15; 211/41.18; 206/454

(58) Field of Classification Search ............... 349/187, 349/58; 211/41.14, 41.15, 41.18; 206/454
See application file for complete search history.

(56) References Cited

U.S. PATENT DOCUMENTS

| 4,872,554 A * | 10/1989 | Quernemoen | 206/454 |
| 5,393,226 A * | 2/1995 | Groom | 432/258 |
| 5,423,422 A * | 6/1995 | Boire et al. | 206/723 |
| 5,492,862 A * | 2/1996 | Misumi | 438/516 |
| 5,570,987 A * | 11/1996 | McKenna | 414/416.01 |
| 5,584,401 A * | 12/1996 | Yoshida | 211/41.1 |
| 5,586,880 A * | 12/1996 | Ohsawa | 432/241 |
| 5,712,040 A * | 1/1998 | Nakahara et al. | 428/421 |
| 5,785,186 A * | 7/1998 | Babbs et al. | 211/41.18 |
| 5,788,082 A * | 8/1998 | Nyseth | 206/711 |
| 5,805,126 A * | 9/1998 | Bassetti | 345/89 |
| 5,853,214 A * | 12/1998 | Babbs et al. | 294/161 |
| 5,853,486 A * | 12/1998 | Ono et al. | 118/719 |
| 5,890,598 A * | 4/1999 | Hayashida et al. | 206/710 |
| 5,950,817 A * | 9/1999 | Iwamoto et al. | 206/204 |
| 6,186,344 B1 * | 2/2001 | Park et al. | 211/41.1 |
| 6,252,233 B1 * | 6/2001 | Good | 250/423 R |
| 6,273,275 B1 * | 8/2001 | Kim et al. | 211/41.18 |
| 6,341,703 B1 * | 1/2002 | Wu | 211/41.18 |

FOREIGN PATENT DOCUMENTS

JP    10120074 A  *  5/1998

OTHER PUBLICATIONS

Togari et al "Air Ionizers in TFT-LCD Manufacturing", Information Display Nov. 1998.*

* cited by examiner

*Primary Examiner* — Wen-Ying P Chen
(74) *Attorney, Agent, or Firm* — McKenna Long & Aldridge LLP

(57) ABSTRACT

A panel receiving device enables anti-electrostatic ions to contact surfaces of panels. The panel receiving device includes at least three panel guides arranged at inner sides within an exterior case. Each panel guide includes support plates for supporting and securing the panels, wherein the support plates contact a minimal area of each of the panels.

9 Claims, 9 Drawing Sheets

PANEL RECEIVING DEVICE

This application claims the benefit of the Korean Application No. P2002-27438 filed on May 17, 2002, which is hereby incorporated by reference for all purposes as if fully set forth herein.

BACKGROUND OF THE INVENTION

1. Field of the Invention

The present invention relates to a panel receiving device facilitating the fabrication of flat panel displays, semiconductors, etc. More particularly, the present invention relates to a panel receiving device capable of receiving thin film transistor substrates, liquid crystal display panels, semiconductor wafers, etc., and removing static electricity from substrates, panels, wafers, etc.

2. Discussion of the Related Art

Cathode ray tubes display images over a curved surface. Liquid crystal displays, however, are flat panel displays capable of displaying images on a substantially flat plane. Liquid crystal displays may be formed extremely thin and, together with plasma display panels, are being developed as next generation flat panel displays.

Liquid crystal display include a liquid crystal display panel for displaying images and a driving unit for applying driving signals to the liquid crystal display panel. The liquid crystal display panel includes first and second glass substrates separated by a layer of liquid crystal material.

The first glass substrate (i.e., the TFT array substrate) supports a plurality of gate lines arranged along a first direction and spaced apart from each other at a predetermined interval, a plurality of data lines arranged along a second direction, substantially perpendicular to the first direction, and spaced apart from each other at a predetermined interval, a plurality of pixel electrodes arranged in a matrix pattern at pixel areas defined at crossings of the gate and data lines, and a plurality of switching devices such as thin film transistors (TFTs) for receiving signals from respective gate lines and, in response to the received signals, transferring signals from corresponding data lines to respective pixel electrodes.

The second glass substrate (i.e., the color filter substrate) supports a black matrix layer for preventing light from being transmitted in regions of the liquid crystal display panel other than the pixel areas, a red/green/blue (R/G/B) color filter layer for selectively transmitting light of predetermined wavelengths, and a common electrode layer.

The first and second substrates may be bonded to each other via a sealant and uniformly separated from each other via spacers arranged between the bonded substrates. Liquid crystal material may be injected between the bonded substrates through a liquid crystal injection inlet formed within the sealant.

Liquid crystal material may be injected into the space (i.e., a cell gap) between the bonded substrates by creating a vacuum within the cell gap and immersing the liquid crystal injection inlet into a reservoir of liquid crystal material. Liquid crystal material is drawn into the cell gap via a capillary force. Once liquid crystal material is injected, the liquid crystal injection inlet is sealed with a sealing material.

Fabricating a liquid crystal display panels according to the aforementioned liquid crystal injection process requires that the thin film transistors and color filter layers be formed on their respective substrates prior to substrate bonding. Accordingly, the first and second substrates are transported several times during the fabrication of the TFTs and color filters layers, e.g., during bonding of the substrates, during liquid crystal material injection, in coupling the driving circuit to the liquid crystal display panel, etc. In transport, the processed substrates are arranged within a receiving device illustrated in, for example, FIG. 1.

Figure 1:
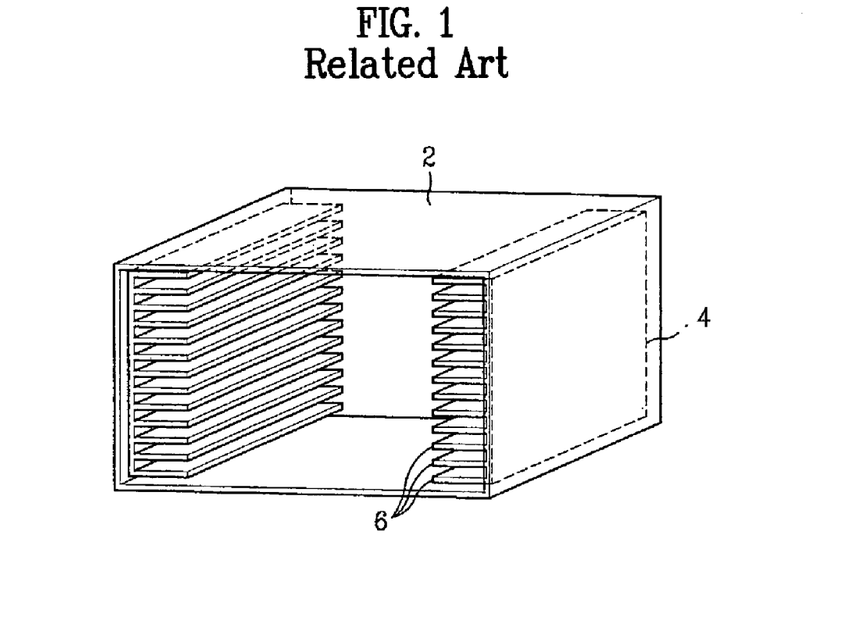
FIG. 1 illustrates a schematic view of a panel receiving device used in manufacturing liquid crystal displays.
Figure 2:
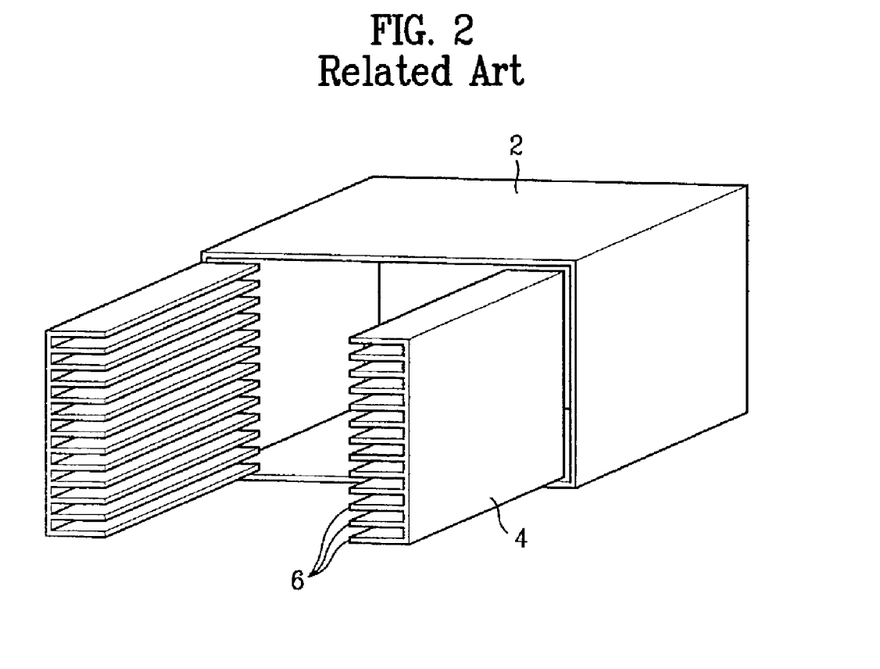
FIG. 2 illustrates partially disassembled view of the panel receiving device shown in FIG. 1.

FIG. 1 illustrates a schematic view of a panel receiving device used in manufacturing liquid crystal displays. FIG. 2 illustrates a partially disassembled view of the panel receiving device shown in FIG. 1.

Referring to FIGS. 1 and 2, a related art panel receiving device used in manufacturing liquid crystal displays includes a box-type case 2 having an opening in one face through which liquid crystal display panels may be inserted into. The case also includes a pair of panel guides 4 formed at opposing the inner sides of the case 2 for supporting unprocessed glass substrates, processed glass substrates, liquid crystal display panels, etc., herein generically referred to as "panels".

Each of the panel guides 4 include a plurality of support plates 6. Accordingly, support plates 6 of respective panel guides 4 face one another. The support plates 6 receive panels and prevent adjacent panels from contacting each other. The support plates 6 are rectangular and contract entire sides of panels that are received within the panel receiving device.

Figure 3:
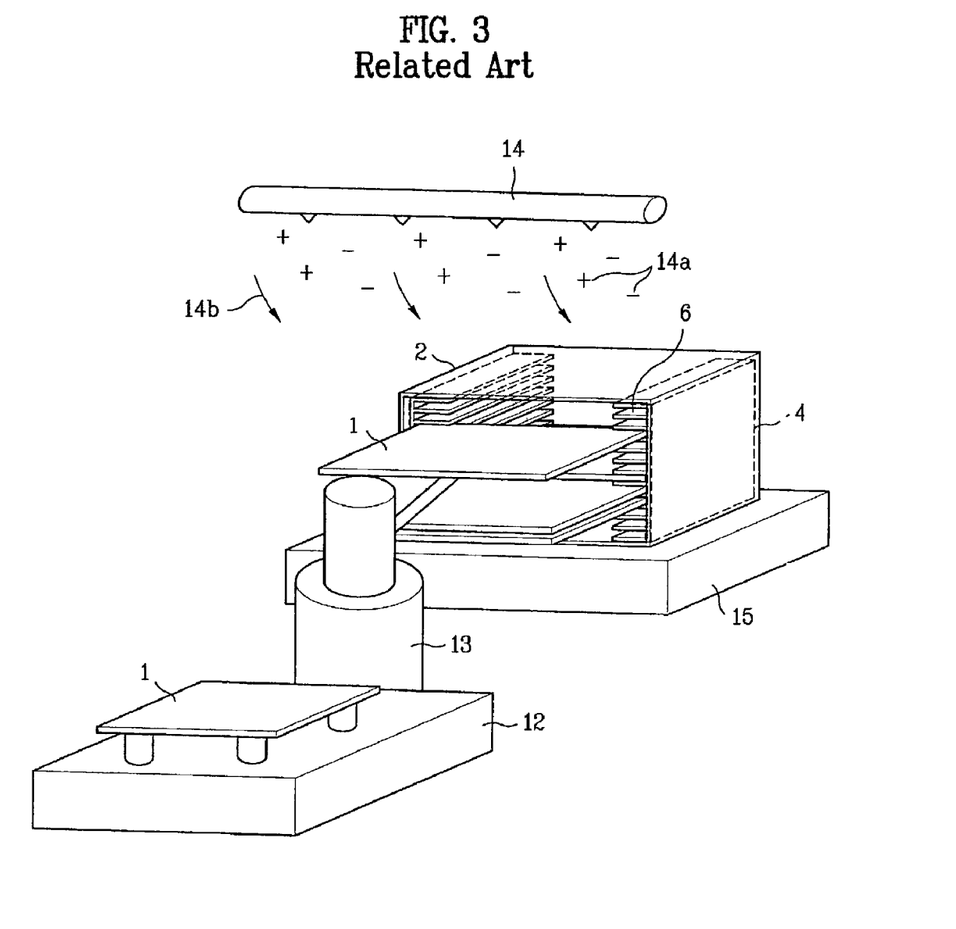
FIG. 3 illustrates a method by which panels are inserted into the related art panel receiving device shown in FIGS. 1 and 2.

FIG. 3 illustrates a method by which panels are inserted into the related art panel receiving device shown in FIGS. 1 and 2.

Referring to FIG. 3, panels 1 are mounted onto a panel stage 12, picked up by a robot 13 or by an operator, and arranged proximate the panel receiving device mounted on a box stage 15. An ionizer 14 is arranged over the panel receiving device to remove any static electricity within the panels 1 by discharging anti-electrostatic ions 14a toward the panels 1.

Figure 4:
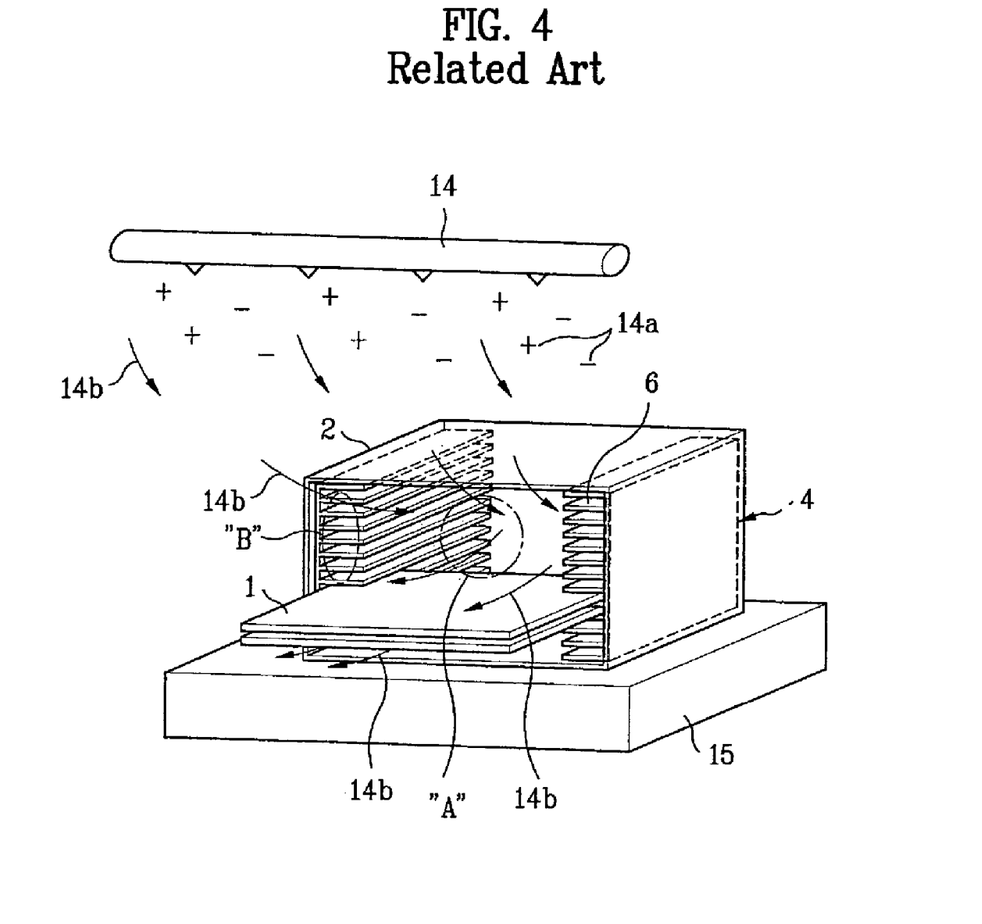
FIG. 4 illustrates the flow of the anti-electrostatic ions shown in FIG. 3.

FIG. 4 illustrates the flow 14b of the anti-electrostatic ions 14a shown in FIG. 3.

Referring to FIG. 4, a central region "A" of the panel receiving device allows anti-electrostatic ions 14a to pass through top and bottom faces of the each of the panels 1 to thereby eliminate static electricity within each of the panels 1. However, anti-electrostatic ions 14a cannot pass through the top and bottom faces of the panels at side regions "B" even in the presence of the airflow 14b of the anti-electrostatic ions 14a because both sides of the panels 1 contact the support plates 6 at side regions "B".

Figure 5:
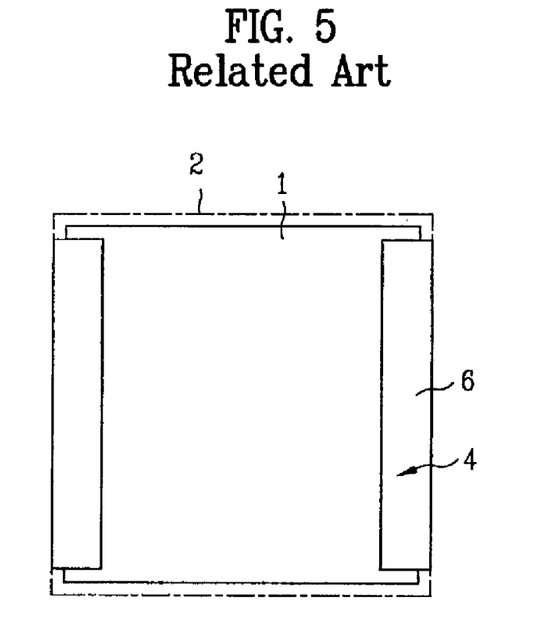
FIG. 5 illustrates the arrangement of support plates within the panel receiving device shown in FIG. 4.

FIG. 5 illustrates the arrangement of support plates 6 within the panel receiving device shown in FIG. 4.

Referring to FIG. 5, the support plates 6 contact the surfaces of the panels substantially across the entire sides of the panels 1. Accordingly, static electricity within the panels 1 cannot be removed sufficiently because the anti-electrostatic ions 14a are unable to pass through a substantial portion of the sides of the panels 1 and the possibility of generating product failures increases.

SUMMARY OF THE INVENTION

Accordingly, the present invention is directed to a panel receiving device that substantially obviates one or more problems due to limitations and disadvantages of the related art.

An advantage of the present invention provides a panel receiving device including at least three panel guides for maximizing exposure of panels to anti-electrostatic ions (e.g., ionized air or gas), wherein the panels are secured within the at least three panel guides and contact between panels and their respective support plates is minimized.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a panel receiving device may, for example, include an exterior case, panel guides arranged at three or more portions within the exterior case, wherein each panel guide includes a plurality of support plates for supporting at least one panel and for separating adjacent panels.

In one aspect of the present invention, the panels may include substrates used in the fabrication of liquid crystal displays or plasma display panels, liquid crystal display panels, semiconductor wafers, and the like.

In another aspect of the present invention, two panel guides may be arranged at a first side (e.g., a right side) within the exterior case and two panel guides may be arranged at a second side within the exterior case, opposing the first side (e.g., a left side).

In yet another aspect of the present invention, support plates included within the panel guides arranged at the first side face support plates included within the panel confront the panel guides arranged at the second side, wherein only corresponding support plates of each of the four panel guides contact respective ones of the panels.

In still another aspect of the present invention, a panel guide may be arranged at the first side within the exterior case, a panel guide may be arranged at the second side within the exterior case, and two panel guides may be arranged at a third side (e.g., rear side) within the exterior case, wherein corresponding support plates of each of the four panel guides contact respective ones of the panels.

In yet another aspect of the present invention, three panel guides may be arranged at the first side within the exterior case and three panel guides may be arranged at the second side within the exterior case, wherein corresponding support plates of each of the six panel guides contact respective ones of the panels.

In one aspect of the present invention, one panel guide may be arranged at the first side within the exterior case, one panel guide may be arranged at the second side within the exterior case, and one panel guide may be arranged at the third side within the exterior case, wherein corresponding support plates of each of the three panel guides contact respective ones of the panels.

In another aspect of the present invention, the panel receiving device may further include an ionizer arranged outside the exterior case for generating a flow of ionized air or gas within the exterior case.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 6:
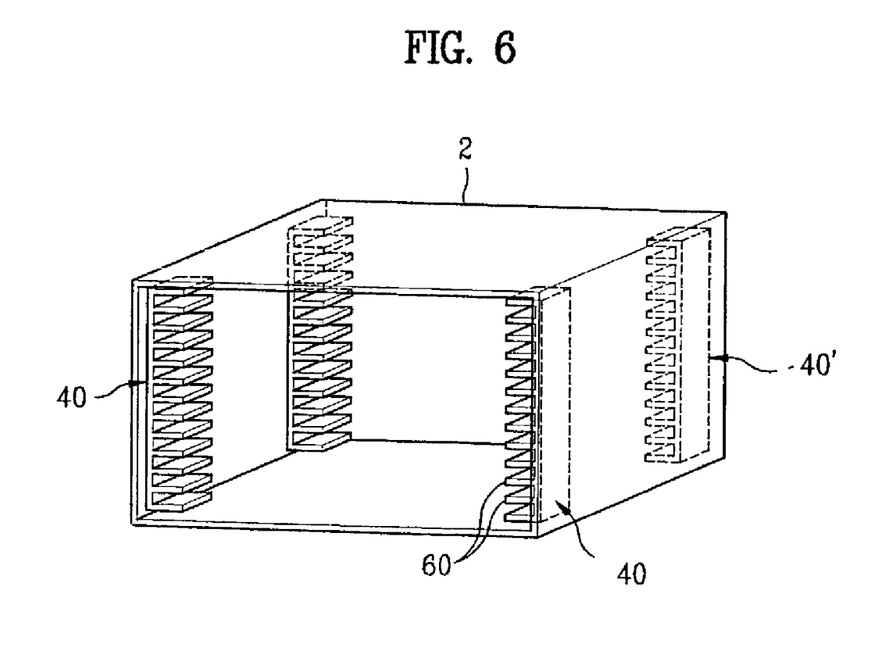
FIG. 6 illustrates a schematic view of a panel receiving device according to a first aspect of the present invention.
Figure 7:
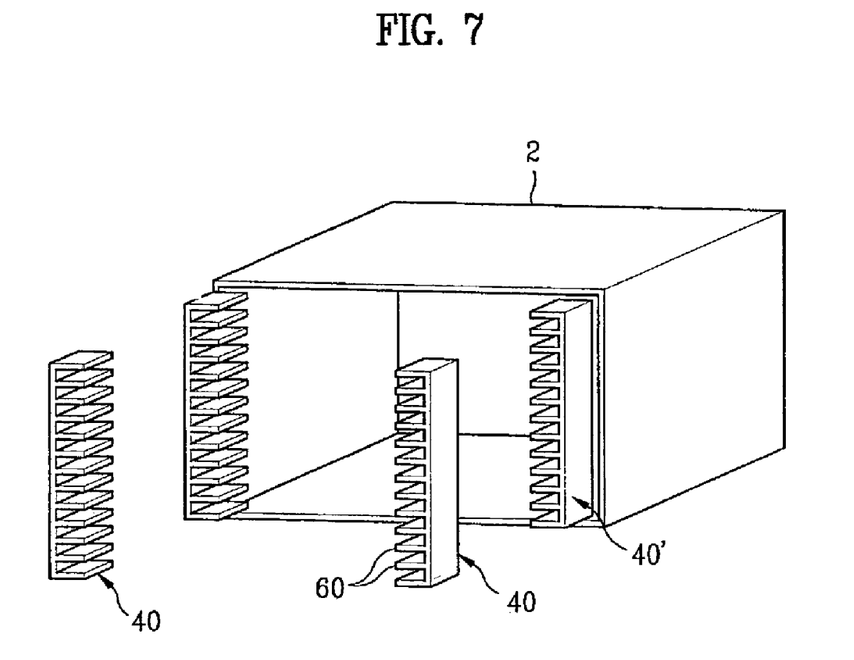
FIG. 7 illustrates a partially disassembled view of the panel receiving device shown in FIG. 6.

FIG. 6 illustrates a schematic view of a panel receiving device according to a first aspect of the present invention. FIG. 7 illustrates a partially disassembled view of the panel receiving device shown in FIG. 6.

Referring to FIG. 6 and FIG. 7, a panel receiving device according to a first aspect of the present invention may, for example, include a box-type exterior case 2 and panel guides 40 arranged substantially vertically at sides within the exterior case 2.

Each of the plurality of panel guides 40 may, for example, include a plurality of support plates 60. The support plates 60 receive panels, prevent adjacent panels from contacting each other, and prevent panels from contacting upper and lower sides of the case 2. In one aspect of the present invention, panels may include substrates used in the fabrication of liquid crystal displays or plasma display panels, liquid crystal display panels, semiconductor wafers, and the like.

In accordance with the principles of the present invention, horizontal spaces defined by adjacent upper and lower support plates 60 within a panel guide 40 are herein referred to as 'slots'. In one aspect of the present invention, each panel guide may, for example, comprise about thirty slots. Accordingly, about thirty panels 1 may be received by, and secured within, the panel receiving device. In one aspect of the present invention, the panel receiving device may be used to transport/store panels 1 between fabrication steps. It should be appreciated that any number of slots may be arranged within each of the panel guides so long as the objective of the present invention is achieved.

In a first aspect of the present invention, four panel guides 40 may be arranged within the case 2 such that each panel contacts support plates at four portions of a panel. Accordingly, panels having a substantially rectangular shape may be received by, and secured within the panel receiving device of the first aspect of the present invention.

Referring still to FIGS. 6 and 7, the panel guides 40 may be arranged at first and second sides (e.g., right and left, respectively). In one aspect, a first panel guide 40 may be arranged at the first side within the exterior case 2 proximate an opening of the exterior case 2, a second panel guide 40' may be arranged at the second side within the exterior case 2 and proximate the opening, a third panel guide 40 may be arranged at the first side within the exterior case 2 further from the opening than the first panel guide, and a fourth panel guide 40' may be arranged at the second side within the exterior case 2 further from the opening than the second panel guide. In one aspect of the present invention, the distance between the first and third panel guides and the distance between the second and fourth panel guides may be set such that the panels received are secured within their respective slots of each of the four panel guides.

The distance by which each of the supporting plates 60 are spaced from each other (i.e., the slot height) determines spacing between adjacent panels received within the panel receiving device. In one aspect of the present invention, each of the support plates 60 is capable of receiving a panel from an operator or a robot 13. When a panel is received by the panel receiving device, the area of the panel that contacts each of the support plates is minimized.

In one aspect of the present invention, the panel guides 40 and support plates 60 may be formed from a material such as an antistatic resin. In another aspect of the present invention, a material such as a metal may be attached to, or included within each of the panel guides 40 and support plates 60.

As will be explained in greater detail below, panels received within the panel receiving device of the present invention may be substantially free of static electricity.

Figure 8:
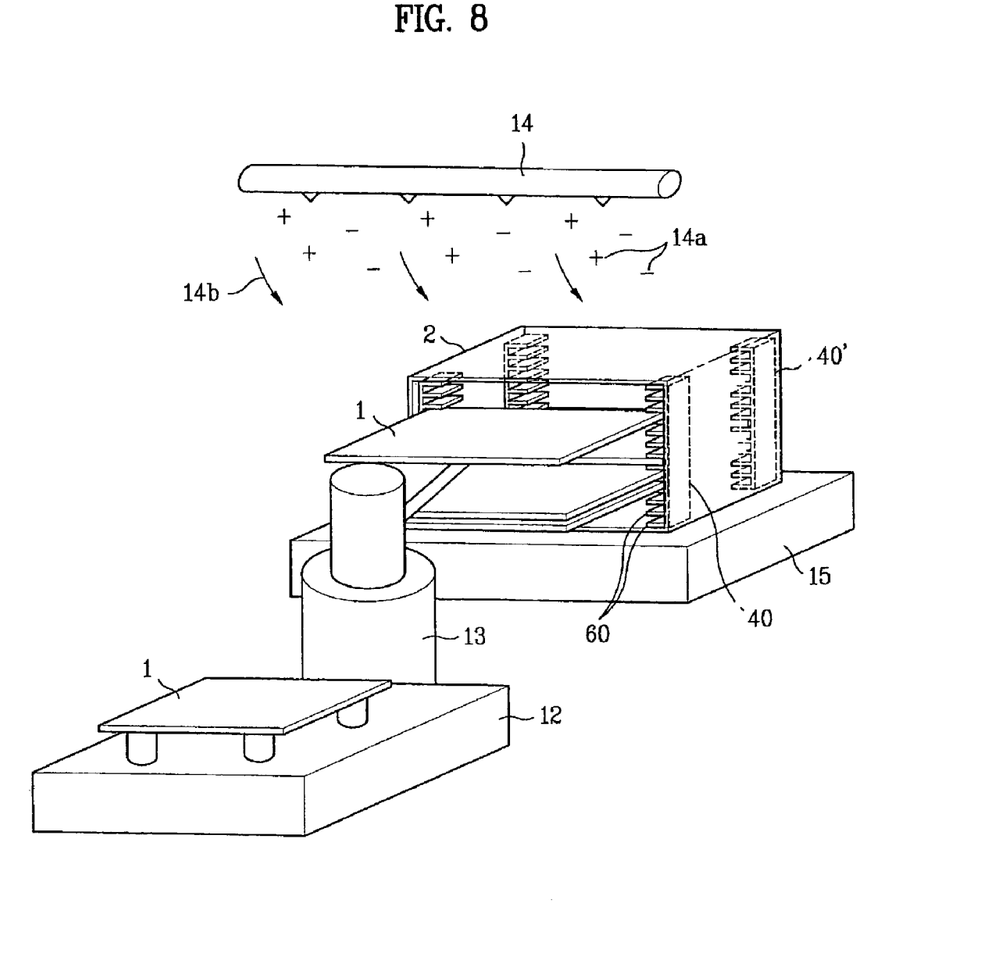
FIG. 8 illustrates a method by which panels are inserted into the panel receiving device shown in FIGS. 6 and 7.

FIG. 8 illustrates a method by which panels are inserted into the panel receiving device of the first aspect of the present invention. Panels illustrated herein may, for example, be used in the fabrication of a liquid crystal display monitor or the like.

Referring to FIG. 8, panels (e.g., substrates on which TFT arrays or color filter arrays are formed, bonded substrates, liquid crystal display panels, etc.) 1 may be mounted onto a panel stage 12 arranged at a first side of a robot 13. In one aspect of the present invention, the panels 1 may be mounted onto the panel stage 12 by an operator or via an automated robot 13. The panels 1 may then be inserted into the panel receiving device via an operator or via the robot 13. A box stage 15 may be arranged at a second side of the robot 13. In one aspect of the present invention, the box stage 15 eliminates static electricity generated within the panels 1. An ionizer 14 may be arranged over the box stage 15 outside the exterior case 2.

In one aspect of the present invention, the ionizer 14 may generate ionized air or gas (hereinafter called 'anti-electrostatic ions') 14a to be provided within the panel receiving device. For example, as the panels 1 are received by the panel receiving device, the ionizer 14 discharges the anti-electrostatic ions 14a. The discharged anti-electrostatic ions 14a are carried into the panel receiving device by a flow 14b generated by a flow controller (not shown).

Figure 9:
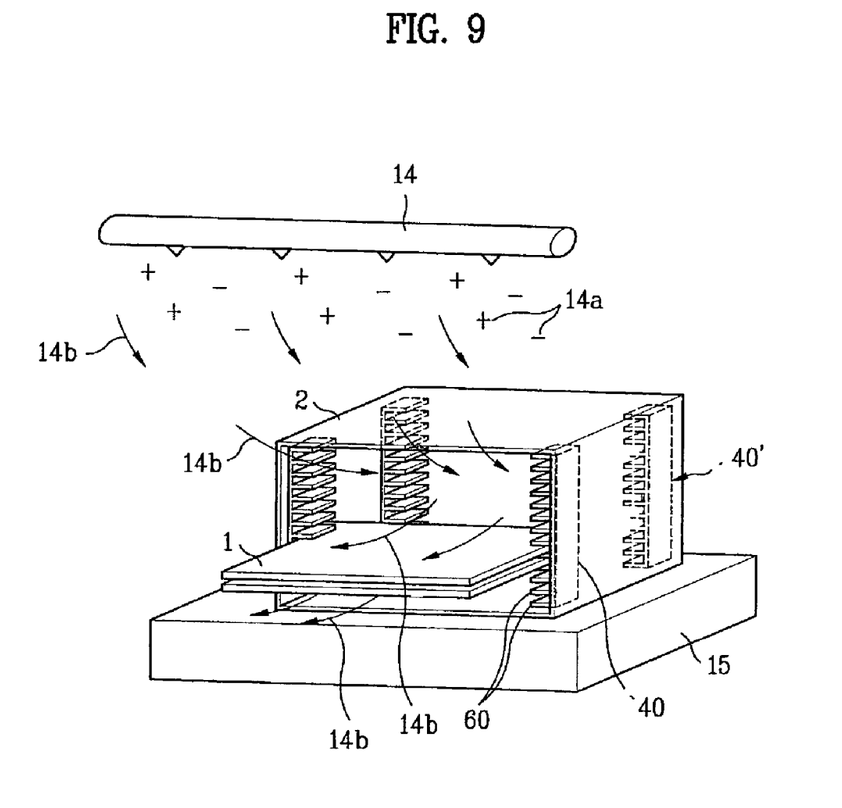
FIG. 9 illustrates the flow of anti-electrostatic ions shown in FIG. 8.

FIG. 9 illustrates the flow 14b of the anti-electrostatic ions 14a shown in FIG. 8.

Referring to FIG. 9, the flow 14b of anti-electrostatic ions 14a enters into a front side of the panel receiving device, static electricity at the top and bottom surfaces of the panels 1 is removed, and the flow 14b of anti-electrostatic ions 14a exits the panel receiving device. In one aspect of the present invention, the top surface of each of the panels 1 does not contact the support plate 60. Accordingly, static electricity can be effectively removed from the top surface of each of the panels 1. In another aspect of the present invention, and contrary to the related art, the bottom surface of each of the panels is minimally contacted at four regions such that the effectiveness of the flow 14b of anti-electrostatic ions 14a to remove static electricity from the bottom surface of each of the panels 1 is minimally degraded. Accordingly, the present invention maximizes the effectiveness of the flow 14b of anti-electrostatic ions 14a to remove static electricity on the surface of the panels 1.

Figure 10:
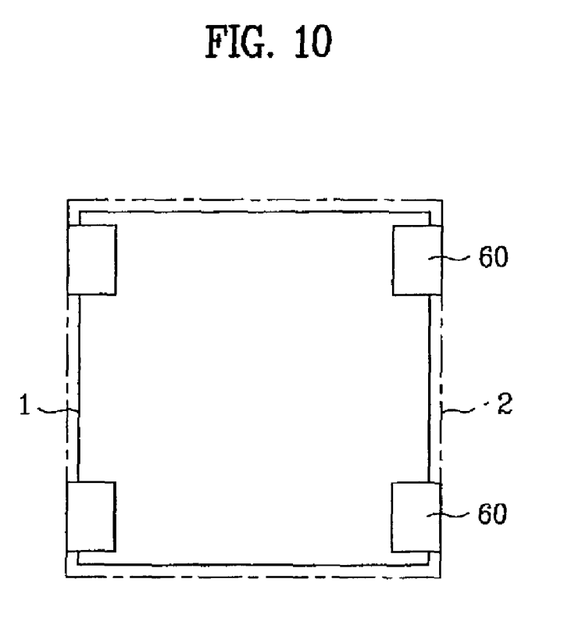
FIG. 10 illustrates the arrangement of support plates within the panel receiving device of the first aspect of the present invention.

FIG. 10 illustrates the arrangement of support plates 60 within the panel receiving device of the first aspect of the present invention.

Referring to FIG. 10, the support plates 60 contact only four portions of the panel 1 such that, for example, the front and rear corners of the sides of the panel 1 are supported and the panel 1 may be secured within the panel receiving device. Accordingly, the support plates 60 minimize the area with the panel 1 is contacted, thereby maximizing the area exposed by the flow 14b of the anti-electrostatic ions 14a.

Figure 11:
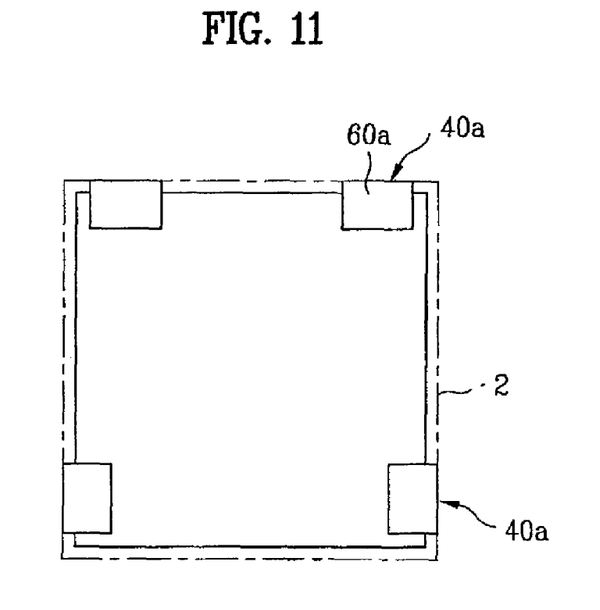
FIGS. 11 to 13 illustrate the arrangement of support plates within the panel receiving devices according to second to fourth aspects of the present invention.
Figure 12:
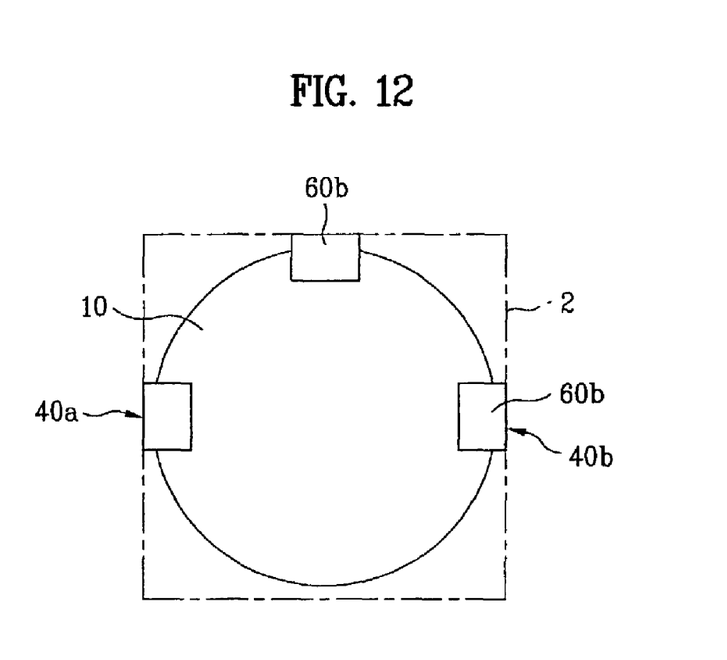
Figure 13:
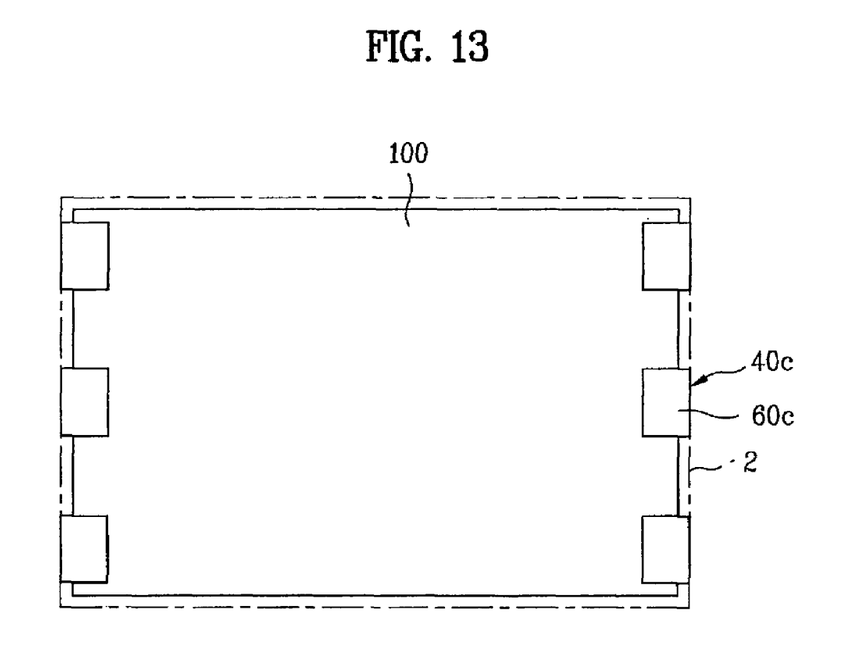

FIGS. 11 to 13 illustrate the arrangement of support plates within the panel receiving devices according to second to fourth aspects of the present invention.

Referring to FIG. 11, according to a second aspect of the present invention, panel guides 40a may be arranged at four areas as in the first aspect of the present invention shown in FIG. 6. First and second panel guides 40a may be arranged at first and second sides within the exterior case 2 proximate the opening while the third and fourth panel guides 40a may be formed at a third side (e.g., the rear side) opposite the opening. The same effect of minimizing contact with the bottom surface of received panels may be realized in the second aspect as is realized by the first aspect of the present invention.

Referring to FIG. 12, in a third aspect of the present invention, support plates 60b may allow for rounded panels 10 (e.g., semiconductor wafers) to be received by, and secured within the panel receiving device. Accordingly, the arrangement of the panel guides 40b according to the third invention minimizes the extent to which bottom surfaces of rounded panels contact support plates, thereby improving the performance of removing static electricity from panels.

According to the third aspect, the rounded panel 10 may be received by a panel receiving device such as that shown in FIG. 6 or a panel receiving device having support plates that are rounded or curved. Referring to FIG. 12, the panel guides 40b, support three areas of the rounded panel 10 and maximize the area exposed by the anti-electrostatic ions 14a. In one aspect of the present invention, first and second ones of the panel guides 40b arranged at the first and second sides within the exterior case 2 may be closer to the opening than the third side opposing the opening. In another aspect of the present invention, a rectangular panel 10 may also be received by, and secured within the slots of the support plates illustrated in FIG. 12.

Referring to FIG. 13, according to a fourth aspect of the present invention, panel guides 40c may be arranged at six regions within the exterior case 2. As sizes of flat display panels such as LCD, PDP, etc., increase, the size of the substrates from which they are made also increase. As the substrates get larger, they become heavier and cannot adequately be supported within four slots. Accordingly, the number of panel guides 40c within a panel receiving device may be increased while the area of each panel contacting the support plate 60c may be reduced to uniformly distribute the weight of the heavier panels. Therefore, the fourth aspect of the present invention facilitates the support the larger-sized panels while improving the removal of static electricity from panels.

While the panels described with respect to the aforementioned aspects of the present invention have been directed toward panels or substrates used in flat displays or semiconductor wafers, it is appreciated that the concepts of the present invention may be applied to other panels requiring the removal of static electricity. The removal of static electricity from various received panels may be maximized by minimizing the area of the panels that contacts the supporting plates. Accordingly, the present invention minimizes static electricity between panels in a panel receiving device, thereby minimizing failure of products fabricated using those panels.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A panel receiving device, comprising:
    an exterior case having an opening in one face through which a panel may be inserted into;
    four or six panel guides arranged within the exterior case, each of the panel guides including a plurality of support plates for separating adjacent panels, wherein the plurality of support plates are formed of an antistatic resin and wherein a distance between adjacent support plates on a panel guide is substantially greater than a thickness of a received panel, and
    an ionizer installed outside the exterior case for generating a flow of ionized air or gas into the exterior case,
    wherein the four panel guides include a first panel guide, a second panel guide, a third panel guide and a fourth panel guide, wherein the first panel guide and the second panel guide are respectively arranged at a left side and a right side of and nearest to the opening and the third and fourth panel guide are arranged at the left side and the right side of and farthest from the opening,
    wherein the first panel guide is installed at a left front, the second panel guide is at a right front, the third panel guide is at a left rear, and the fourth panel guide is at a right rear,
    wherein a distance between the first and the third panel guides is changed according to a size of the panel, wherein a distance between the first and the second panel guides is changed according to a size of the panel.

2. The panel receiving device of claim 1, wherein the panel comprises a substrate used in the fabrication of a liquid crystal display.

3. The panel receiving device of claim 1, wherein the panel comprises a substrate used in the fabrication of a plasma display panel.

4. The panel receiving device of claim 1, wherein the panel comprises a liquid crystal display panel.

5. The panel receiving device of claim 1, wherein the panel comprises a semiconductor wafer.

6. The panel receiving device of claim 1, wherein the plurality of panel guides comprising a first panel guide, a second panel guide, a third panel guide and forth panel guide, wherein the first panel guide and the second panel guide are respectively arranged at a left side and a right side adjacent to the opening of the exterior case and the third panel guide and forth panel guide are arranged at a rear side within the exterior case, the plurality of support plates of the third panel guide and fourth panel guide are toward one direction and the plurality of support plates of third and fourth panel guides are not parallel with the plurality of support plates of the first panel guide and the second panel guide.

7. The panel receiving device of claim 1, wherein the plurality of panel guides comprising a first panel guide, a second panel guide, a third panel guide and forth panel guide, wherein the first panel guide and the second panel guide are respectively arranged at a left side and a right side adjacent to the opening of the exterior case and the third panel guide and forth panel guide are arranged at a left side and a right side apart from the first panel guide and the second panel guide, the plurality of support plates of the third panel guide and fourth panel guide are parallel with the plurality of support plates of the first panel guide and the second panel guide.

8. A panel receiving device, comprising:
    an exterior case having an opening in one face through which a panel may be inserted into;
    four or six panel guides having groups of slots defined by a plurality of support plates arranged within the exterior case, each group of slots comprising at least one slot for receiving a portion of a panel, wherein the plurality of support plates are formed of an antistatic resin and wherein a height of each slot is substantially greater than a thickness of the received portion of the panel; and
    when a number of the panel guides is four, the panel guides further include a first panel guide, a second panel guide, a third panel guide and a fourth panel guide, wherein the plurality of support plates of the third panel guide and fourth panel guide arranged at a rear side within the exterior case are toward one direction and the plurality of support plates of first and second panel guides respectively arranged at the left side and the right side adjacent to the opening of the exterior case are toward the other direction are parallel with the plurality of support plates of the third panel guide and the fourth panel guide, or the plurality of support plates of the first, the second, the third and the fourth panel guides are parallel,
    when the number of the panel guides is six, the panel guides further include a fifth panel guide and a sixth panel guide, wherein the plurality of support plates of the first, the second, the third, the fourth, the fifth and the sixth panel guides are parallel,
    wherein the first panel guide is installed at a left front, the second panel guide is at a right front, the third panel guide is at a left rear, and the fourth panel guide is at a right rear,
    wherein a distance between the first and the third panel guides is changed according to a size of the panel, wherein a distance between the first and the second panel guides is changed according to a size of the panel,
    an ionizer installed outside the exterior case for generating a flow of ionized air or gas into the exterior case.

9. A method of removing static electricity from the surface of a panel, comprising:
    providing an exterior case having an opening in one face through which a panel may be inserted into;
    installing four or six panel guides within the exterior case and an ionizer outside the exterior case for generating a flow of ionized air or gas into the exterior case, wherein installing locations of the plurality of panel guides within the exterior case are made adjustable such that the installing locations of the plurality of panel guides are changed with respect to a shape of the panel;
    wherein the four panel guides include a first panel guide, a second panel guide, a third panel guide and a fourth panel guide, wherein the first panel guide and the second panel guide are respectively arranged at a left side and a right side of the opening and the third and fourth panel guide are respectively arranged at the opposite side of the opening at a left side and a right side of the opening, wherein the first panel guide is installed at a left front, the second panel guide is at a right front, the third panel guide is at a left rear, and the fourth panel guide is at a right rear, wherein a distance between the first and the third panel guides is changed according to a size of the panel, wherein a distance between the first and the second panel guides is changed according to a size of the panel, providing a panel receiving device for securing at least one panel within a plurality of slots defined by a plurality of support plates, wherein the plurality of support plates are formed of an antistatic resin and wherein an upper surface of the at least one secured panel does not contact the plurality of support plates and wherein a lower surface of the at least one secured panel contacts only one of the plurality of support plates from each of the plurality of slots; and generating a flow of anti-electrostatic ions by the ionizer over top and bottom surfaces of the at least one panel.

* * * * *